United States Patent [19]

Choi

[11] Patent Number: 5,610,870
[45] Date of Patent: Mar. 11, 1997

[54] CIRCUIT AND METHOD FOR CONTROLLING THE IMPEDANCE OF A SERIAL ACCESS MEMORY

[75] Inventor: Go-Hee Choi, Seoul, Rep. of Korea

[73] Assignee: LG Semicon Co., Ltd., Cheongju, Rep. of Korea

[21] Appl. No.: 624,196

[22] Filed: Mar. 28, 1996

[30] Foreign Application Priority Data

Mar. 28, 1995 [KR] Rep. of Korea .......................... 96-6593

[51] Int. Cl.⁶ ................................................... G11C 13/00
[52] U.S. Cl. .......................... 365/226; 365/221; 365/149
[58] Field of Search ..................................... 365/221, 206, 365/149

[56] References Cited

U.S. PATENT DOCUMENTS

| | | | |
|---|---|---|---|
| 4,281,401 | 7/1981 | Redwine et al. | 365/222 |
| 4,322,635 | 3/1982 | Redwine | 307/221 |
| 4,667,313 | 5/1987 | Pinkham et al. | 365/240 |
| 4,864,544 | 9/1989 | Spark et al. | 365/221 |
| 4,947,373 | 8/1990 | Yamaguchi et al. | 365/189.04 |
| 5,327,386 | 7/1994 | Fudeyasu | 365/221 |

*Primary Examiner*—David C. Nelms
*Assistant Examiner*—Michael T. Tran
*Attorney, Agent, or Firm*—Alan R. Loudermilk

[57] ABSTRACT

A circuit for controlling a serial access memory is disclosed. A memory cell array is accessed through a pair of bit lines. One or more registers are provided for receiving and storing data through the bit lines. Sequential transmission switches connect the registers to associated data buses, and are sequentially activated in accordance with selection signals of an address decoder. A circuit in accordance with the invention further includes a multi-stage impedance controlling means for controlling the impedance of a power line for the registers through three or more stages during a data transmission. The impedance controlling means includes first and second MOS transistors connected in parallel between a power source and the registers. The first MOS transistor has a gate connected to a control signal for forming a high impedance at some point in time during a data transmission, and the second MOS transistor has a gate connected to a fixed voltage. The first and second MOS transistors are PMOS transistors, and the gate of the second MOS transistor is connected to a ground potential.

24 Claims, 6 Drawing Sheets

CIRCUIT AND METHOD FOR CONTROLLING THE IMPEDANCE OF A SERIAL ACCESS MEMORY

FIELD OF THE INVENTION

The present invention relates to a circuit and method for controlling a serial access memory, and specifically to a multi-stage impedance control means used as part of such a circuit or with such a method.

BACKGROUND OF THE INVENTION

A serial access memory is used for serial data storing, or data conversion from serial to parallel and vice versa. FIG. 1 is a schematic block diagram illustrating a conventional circuit for controlling a serial access memory (SAM).

This conventional circuit includes an address buffer 1 for separating an input address into a row address (X address) and a column address (Y address); an X address decoder 7 for decoding the X address to select a word line; a Y address decoder 2 for decoding the Y address to generate sequential switching signals; an I/O control buffer section 10 for converting serial data into parallel data and vice versa; a data bus 15 connected to I/O section 10; a sequential transmitting switch 11 connected to the data bus; a plurality of first serial access registers 8 connected to the sequential transmitting switch; a first transmitting switch 12 connected to the first registers; for transmitting data to a plurality of second serial access registers 9 connected thereto; a second transmitting switch 13 connected to the second registers for transmitting data to a memory cell array 14; a transmission control section 4 for generating control signals to turn on and off the first and second transmitting switches; a first register control section 5 for controlling the power source for the first register; a second register control section 6; a read/write control section 3 for supplying control signals to first and second register control sections 5 and 6; and memory cell array 14 for writing and reading data to and from a bit line connected to the second transmission switch 13.

When reading the data, the row and column addresses are separated into X and Y addresses. The X address is decoded by X address decoder 7, and one of word lines $WL_1$–$WL_n$ are selected. The Y address is decoded by Y address decoder 2, and there is selected a proper switch set from among transmission switches which are connected between serial access register 8 and data bus 15.

The input and output of data between memory cell array 14 and data input/output line 16 is carried out in the following manner. When reading data, the output of X address decoder 7 selects a word line in accordance with the value of the X address. The cell data of memory cell array 14 which is connected to the specified word line is transmitted to second register 9, the word line being selected when second transmission switch 13 is turned on. Then first transmitting switch 12 is turned on, so that the data of the second register is transmitted to and stored in first register 8.

As Y address decoder 2 decodes the Y address to turn on transmitting switches 11 in a sequential manner, the data in first register 8 is transmitted in a parallel manner to input/output control buffer section 10. This parallel data is converted into perfect serial data by input and output control buffer section 10, and output through data I/O line 16.

To carry out a write operation, the serial data input through data I/O line 16 is converted into parallel, and loaded onto data bus 15. At the same time, in accordance with the Y address decoded by Y address decoder 2, appropriate transmitting switches are selected and turned on. The data on bus 15 is then transmitted to and stored in first register 8. When this register is filled, first transmitting switch 12 is turned on, so that second register 9 is then filled with the data. Then the X address decoder decodes the X address to select a word line, and, when the second transmitting switch 13 is turned on, the data in the second register is transferred to the memory cells which are connected to the selected word line.

In order to show the data transmission procedure between memory cell array 14 and data bus 15, FIG. 2 illustrates a conventional serial access memory control circuit connected between a pair of bit lines and a pair of data bus lines.

The conventional serial access memory control circuit of FIG. 2 usually includes a data bus 151 having a plurality of pairs of data bus lines DB and /DB, and this data bus 151 and first register 81 are inter-connected through transmission switches 111. Transmission switches 111 are controlled by a Y-DECOUT signal, while first register 81 is connected to register control section 51, so that the supplied power source can be controlled.

Further, first register 81 and second register 91 are inter-connected through transmission switch 121, and second register 91 is also connected to second register control section 61, so that the supplied power source can be controlled. Second register 91 is also connected to memory cell array 141 through transmission switch 131.

In other words, two cells which are connected from memory cell array 141 to word lines WL1 and WL2 are also connected to bit lines BL and /BL. Further, they are connected to second register 91 through second switch 131 which is controlled by signal TR2. Second register 91 usually consists of two NMOS transistors and two PMOS transistors. The second register is connected to first register 81 through first transmission switch 121 which is controlled by signal TR1. First register 81 is connected through a sequential transmitting switch 111 to data bus 151. The power source for first register 81 is controlled by first register control section 51. Further, first and second register control sections 51 and 61 are controlled by control signals RE1 and RE2 of R/W control section through two stages. Specifically, they are controlled to be in a low impedance state (turned on) or to a high impedance state (turned off).

In the circuit of FIG. 2, the data flow during the read/write operations is as described above referring to FIG. 1. Here, only the on/off timings of respective switches 111, 121 and 131 during the read/write operations, and the enable timings of first and second registers (serial access memory registers) 81 and 91 will be described, with reference to the timing chart of FIG. 3.

When carrying out a read operation, word lines WL1 and WL2 are selected, and, thus, if a voltage is supplied, the transistor of the relevant cell is turned on. Then the charge of the cell capacitor is distributed to bit lines BL and /BL, and, accordingly, the data from the cell can be read by a sense amplifier. The voltage distribution of bit lines BL and /BL becomes as shown in FIG. 3. Signal RE2 (which is used for controlling the power source for the second register) is then generated by R/W control section 3 with a high level. As a result, the PMOS transistor is turned off, and therefore, the second register 91 is put in a floating state. At the same time, control signal TR2 becomes high (control signal TR2 is a control signal of second transmission switch 131 which connects bit lines BL and /BL of first register 81 to bit lines A and /A respectively of the second register 91) with the result that the voltages of bit lines BL and /BL are stored into the second register 91. Therefore, even when the operation of the word line and the sense amplifier stop, the cell data is stored in the second register. Signal RE1 (which controls the power source for the first register) then becomes high, and at the same time, control signal TR1 of first transmission switch 121 becomes high to connect bit lines A and /A of the second register 91 to bit lines B and /B of the first register 81, with the result that the voltages of bit lines A and /A are stored into the first register 81.

Output signal Y-DECOUT of the Y decoder (which is a signal for controlling transmission switch 111) then becomes high, so that the data bus is connected to bit lines B and /B of the first register. Consequently, the data of the first register is transmitted through bit lines B and /B to data buses DB and /DB respectively.

When carrying out a write operation, output signal Y-DECOUT of the Y becomes high, so that the data loaded on data buses DB and /DB is transmitted to the first register. Meanwhile, signals RE1 and RE2 become low, so that power is applied to the first and second registers. In this state, signal TR1 becomes high, so that the voltages of bit lines B and /B1 are stored into the second register. Then word lines WL1 and WL2 are selected to supply the voltage to turn on the transistor of the relevant cell, so that the voltages of bit lines BL and /BL can be supplied to the cell capacitor. Then signal becomes high to connect bit lines B and /B to bit lines A and /A of the second register, with the result that the voltages of bit lines A and /A of the second register are stored into the cell capacitor. Thereafter, the voltage of the word line is removed, so that the transistor of the cell is turned off, and the capacitor charge is maintained.

In the conventional serial access memory control circuit described above, when carrying out a read operation, signal RE2 is made to be high at the time when the data is transmitted from memory cell array 141 to second register 91. Thus second register (REG2) 91 is put in a floating state, to smoothen data transmission. Otherwise, signals RE1 and RE2 are made to be low, so that first and second registers 81 retain their data.

When carrying out a write operation, signals RE1 and RE2 are maintained at a low level, so that the power is supplied to both first and second registers 81 and 91 all the time.

Therefore, in the conventional serial access memory control circuit of FIG. 2, one PMOS transistor is utilized, so that when control signals TR1 and TR2 for the transmission switch become high, signals RE1 and RE2 also become high. The reason why the power source for the registers is turned off to put them in a floating state at the time when the data is transmitted is as follows. In order to transmit the data in a sure manner, the impedance of the power source at the receiving side is increased, and the power of the transmitting side is made to dominate the power of the receiving side, so that the data receiving side is subordinated to the transmitting side.

However, in the conventional serial access memory control circuit, the serial accessing registers are controlled to be floating at transmitting time. Therefore, the power source is momentarily disconnected from the register, with the result that the voltage states of bit lines A and /A and B and /B can become unstable. Further, the power sources are turned on and off almost simultaneously, and therefore, the voltage state of the respective nodes of the registers becomes unstable, and considerably high on/off noises are generated, so that the transmitted data can be corrupted. This also causes the stabilizing time for the transmission speed to increase.

SUMMARY OF THE INVENTION

Therefore it is an object of the present invention to overcome the disadvantages of prior art circuits for controlling serial access memories.

To achieve this object, the circuit for controlling a serial access memory according to the present invention includes: a memory cell array for outputting memory cell data (selected by a word line) through a pair of bit lines; one or more storage registers for receiving the data through the bit lines to store the data; sequential transmission switches connected to the registers and data buses to be sequentially activated in accordance with selection signals of an address decoder; and the stored data in the registers being outputted in a serial.

A multi-stage impedance control means is used for controlling an impedance of a power line for the registers during a data transmission. That is, instead of the conventional register control sections 5 and 6, the first embodiment of the present invention uses a multi-stage (e.g. up to two or three or more stages) impedance controlling means.

The impedance controlling means includes: first and second MOS transistors connected in parallel between a power source and the registers; the first MOS transistor having a gate connected to a control signal for forming a high impedance during a data transmission; the second MOS transistor having a gate connected to a fixed voltage; the first and second MOS transistors being PMOS transistors; and the gate of the second MOS transistor being connected to a ground potential.

In a further embodiment, the multi-stage impedance controlling means includes: first and second MOS transistors connected in parallel between a power source and the registers; third and fourth MOS transistors connected in parallel between the registers and ground potential; the first and third MOS transistors having gates connected to control signals to form a high impedance at the time point of a data transmission; and the second and fourth MOS transistors having gates connected to a fixed potential.

In this second embodiment, the first and second MOS transistors are PMOS transistors, while the third and fourth MOS transistors are PMOS transistors. The gate of the second MOS transistor is connected to ground potential, and the gate of the fourth MOS transistor is connected to the power source voltage.

The storage register may consist of two registers which are serially connected, and in which a comprehensive transmission switch is disposed at the middle, so that they can give and receive data from each other.

Alternatively the storage register may consist of two registers which are connected in parallel between the memory cell array and the data bus, the registers being coupled to a sequential transmission switch and a comprehensive transmission for transmitting and receiving transmitting data to and from the data bus.

BRIEF DESCRIPTION OF THE DRAWINGS

The above object and other advantages of the present invention will become more apparent from the detailed description below of the preferred embodiments of the present invention with reference to the attached drawings in which.

DESCRIPTION OF THE PREFERRED EMBODIMENTS

Figure 1:
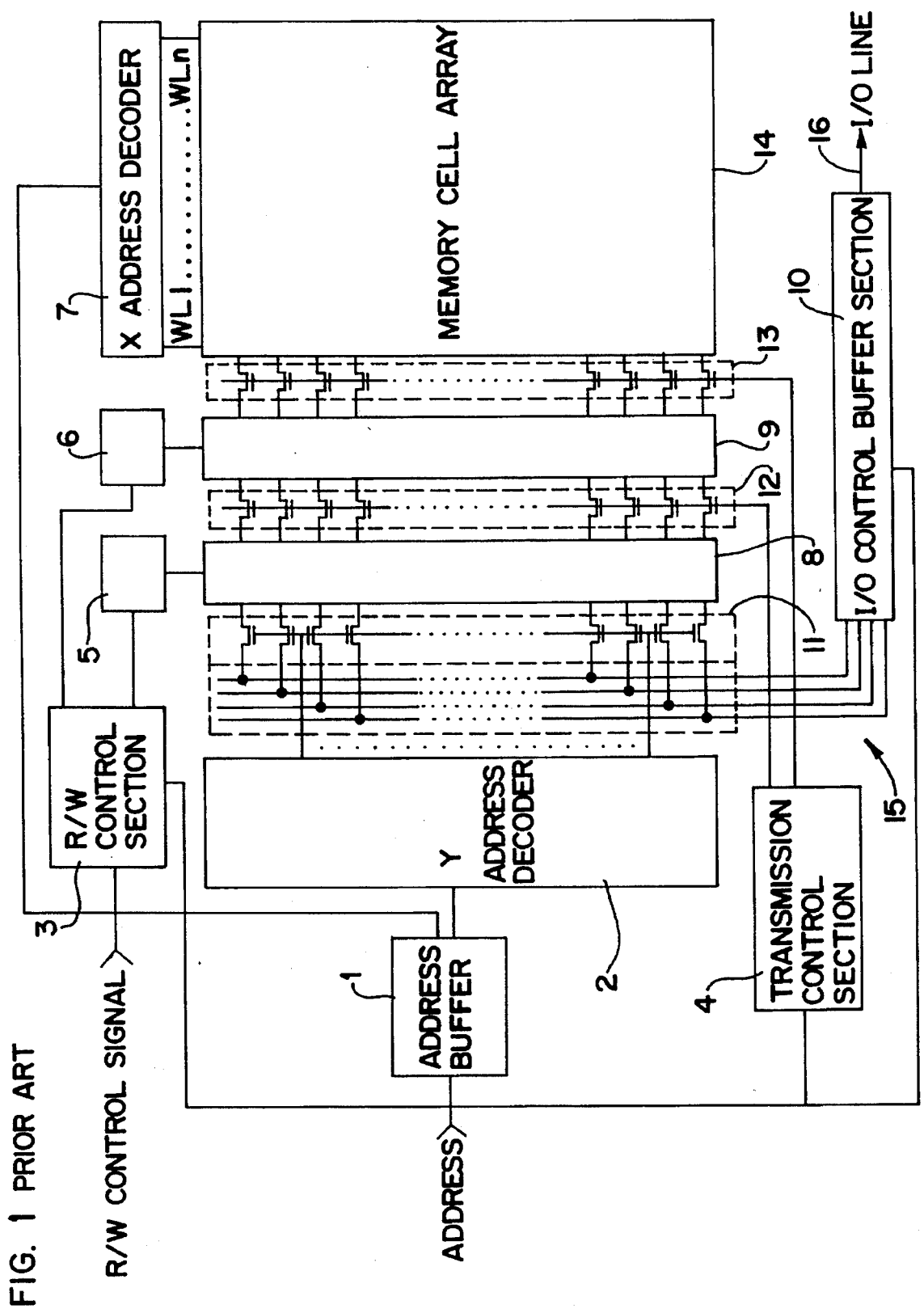
FIG. 1 is a block diagram illustrating a conventional circuit for controlling a serial access memory.
Figure 2:
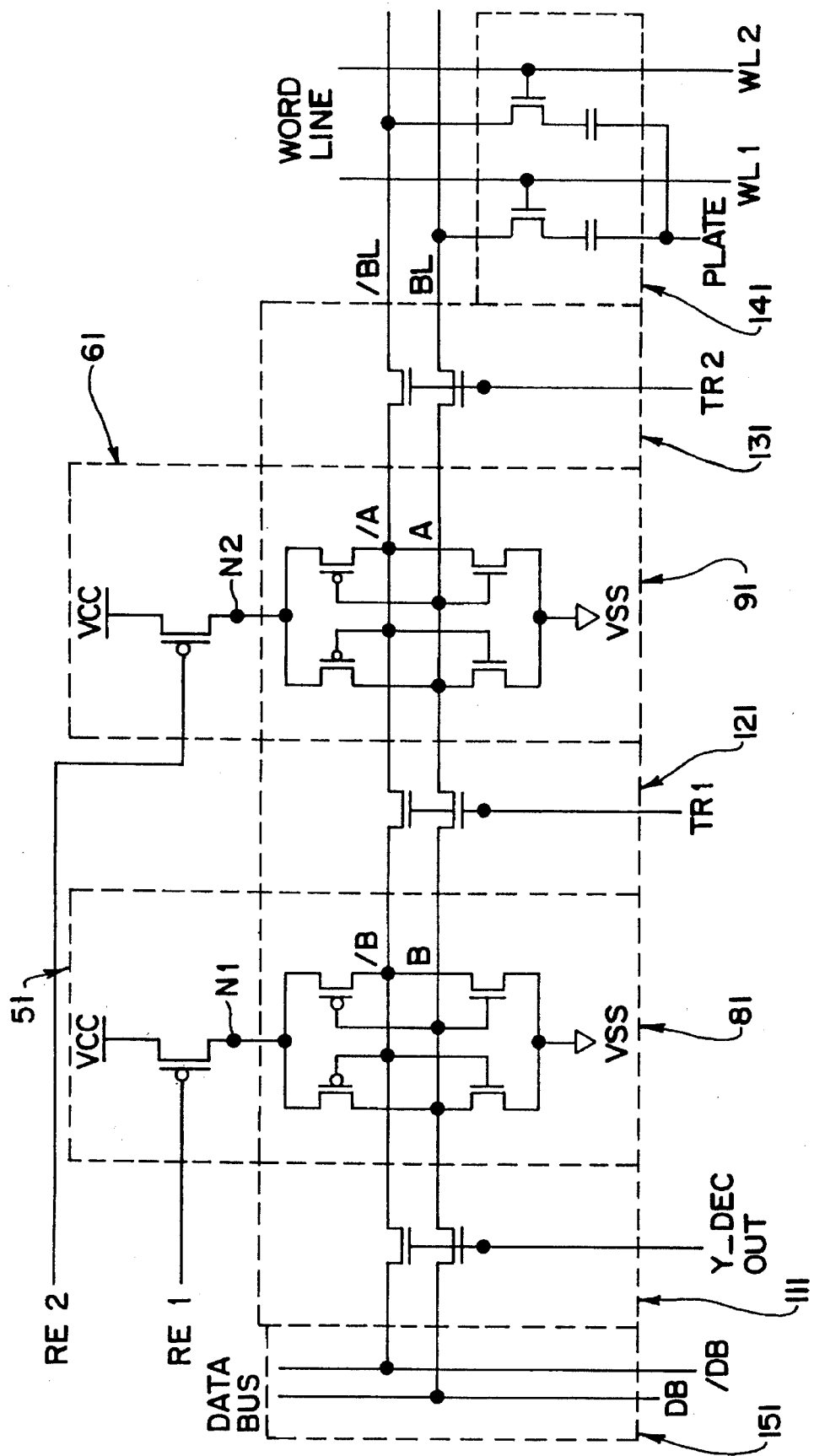
FIG. 2 illustrates a more detailed electrical diagram of a conventional circuit for controlling serial access memory.
Figure 3:
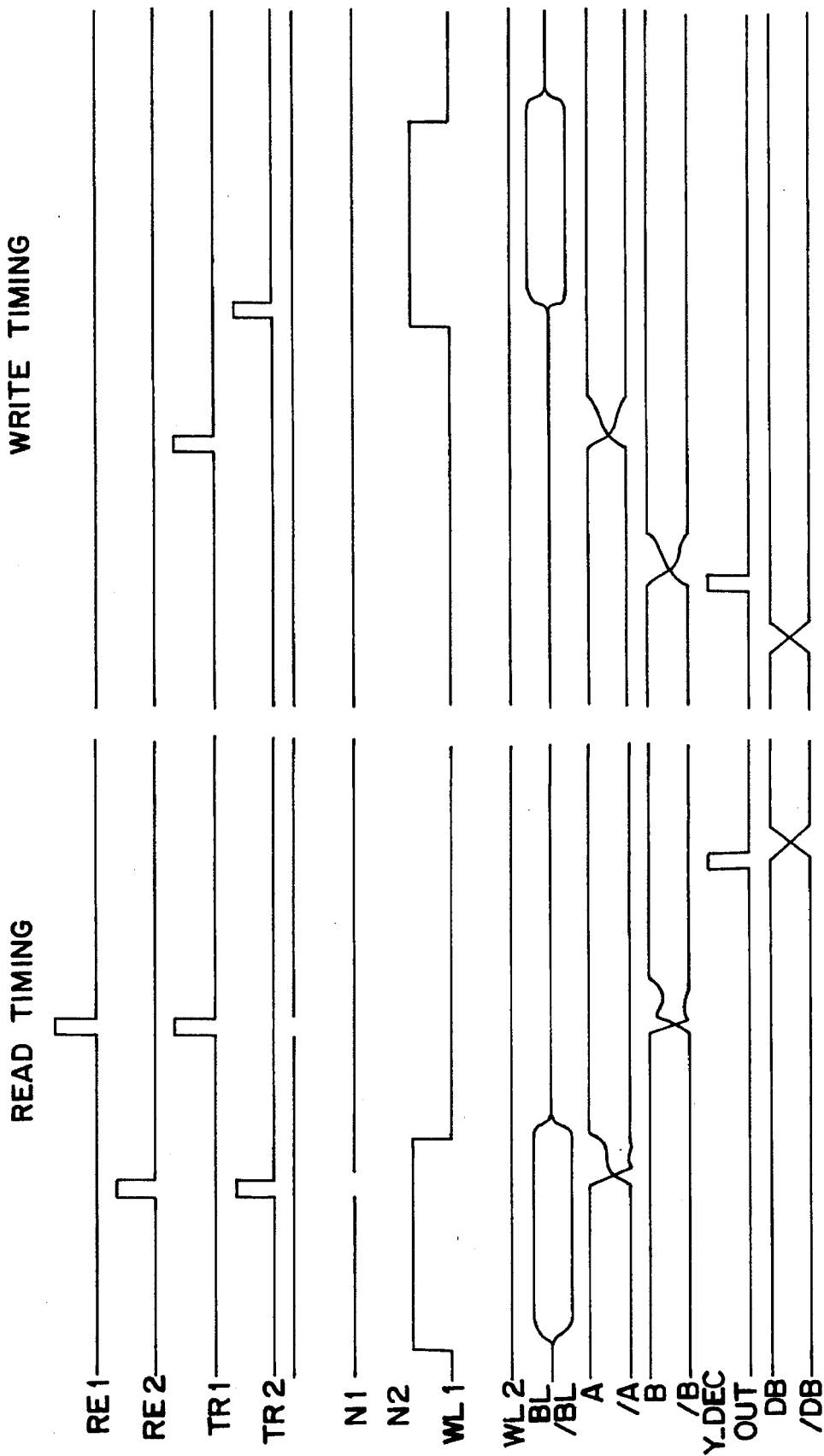
FIG. 3 is a chart showing the timing operation of the conventional circuit for controlling a serial access memory.

The circuit for controlling a serial access memory according to the present invention is similar to that depicted in FIG. 1, except that an impedance controlling means for the register power supply line is different from that used in the prior art of FIG. 2.

Figure 4:
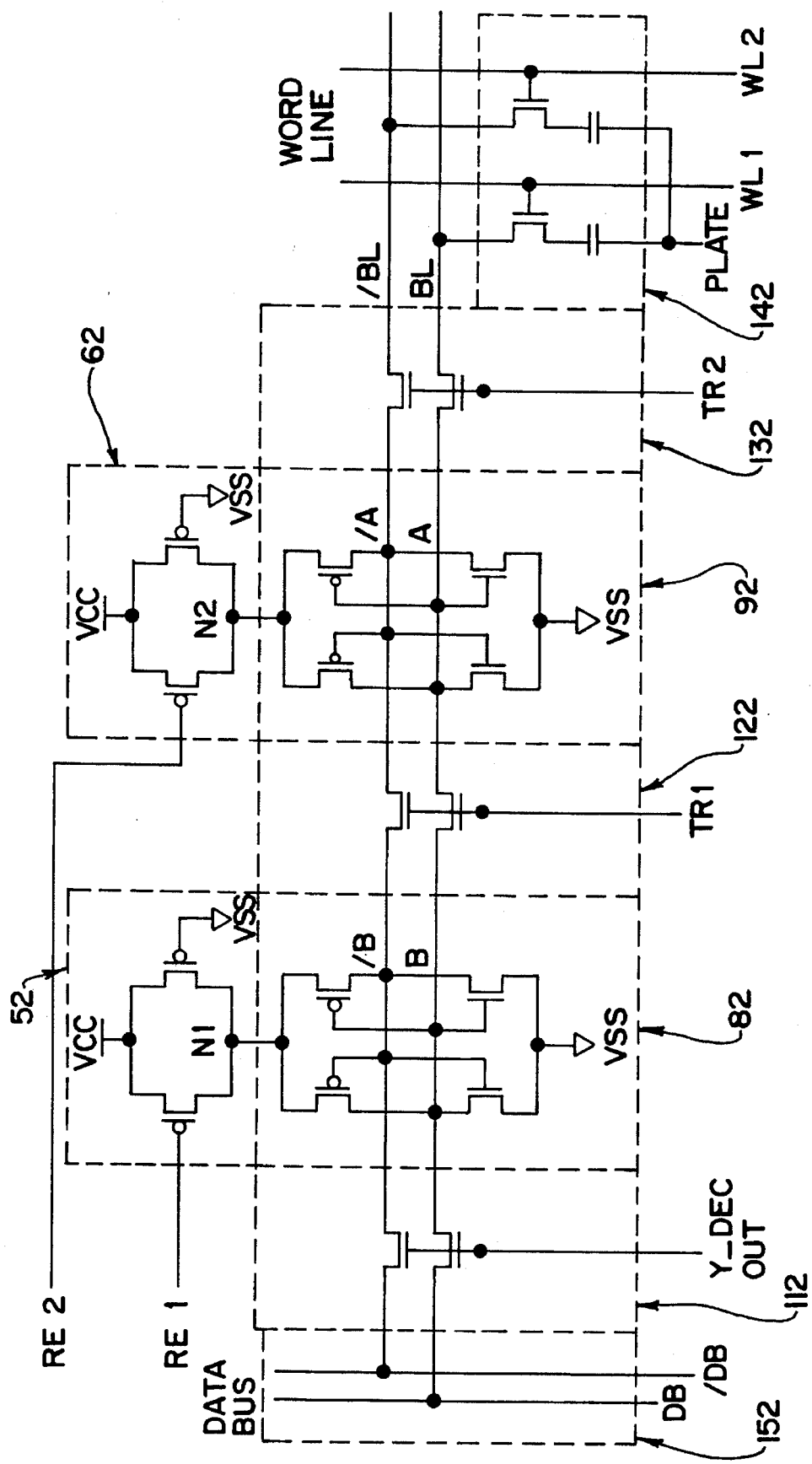
FIG. 4 illustrates a circuit for controlling a serial access memory according to the present invention.

FIG. 4 illustrates a circuit for controlling-a serial access memory according to one embodiment of the present invention.

In this circuit, a data bus 152 having a plurality of pairs of data bus lines DB and /DB is provided. Bus 152 and first register 82 are connected together through sequential transmission switch 112. Sequential transmission switch 112 is controlled by output Y-DECOUT of Y address decoder. The application of power to first register 82 is controlled by first impedance controlling means 52 (which is one of a multi-stage impedance controlling means); the latter is controlled by control signal RE1 of R/W control section. The application of power to second register 92 is controlled by second impedance controlling means 62 (which is one of the multi-stage impedance controlling means); the latter is controlled by signal RE2. That is, the power line impedance is controlled by control signal RE2 of R/W control section. Second register 92 is connected through second transmission switch 132 to bit lines of memory cell array 142 through appropriate sense amplifier circuits (not shown) in memory cell array 142.

In memory cell array 142, two cells which are connected to word lines WL1 and WL2 are connected to bit lines BL and /BL, and they are further connected through second transmission switch 132 to second register 92. Second transmission switch 132 is controlled by control signal TR2 of transmission control section 4 in such a manner that data transmission between array 142 and second register 92 can be carried out. Second register 92 consists of two NMOS transistors and two PMOS transistors. Second register 92 is connected to first register 82 through first transmission switch 122 which is controlled by control signal TR1 of transmission control section 4 in such a manner that data transmission between array first register 82 and second register 92 can be carried out. First register 82 is connected through sequential transmission switch 112 to data bus 152.

Each of the multi-stage impedance controlling means 52 and 62 respectively include two PMOS transistors connected in parallel, and a gate of a first transistor of each receives control signal RE1 or RE2 respectively from R/W control section, while a ground potential is supplied to the gate of a second transistor of each to maintain it in a turned-on state all the time.

The operation of the circuit of FIG. 4 will be described referring to the timing chart of FIG. 5.

When carrying out a read operation, a voltage is first supplied to word lines WL1 and WL2 which have been selected by an X address. Then the transistor of the relevant cell is turned on, with the result that the charges of the cell capacitor is distributed over bit lines BL and /BL, and the data is read by a sense amplifier (not shown) in memory cell array 142.

Figure 5:
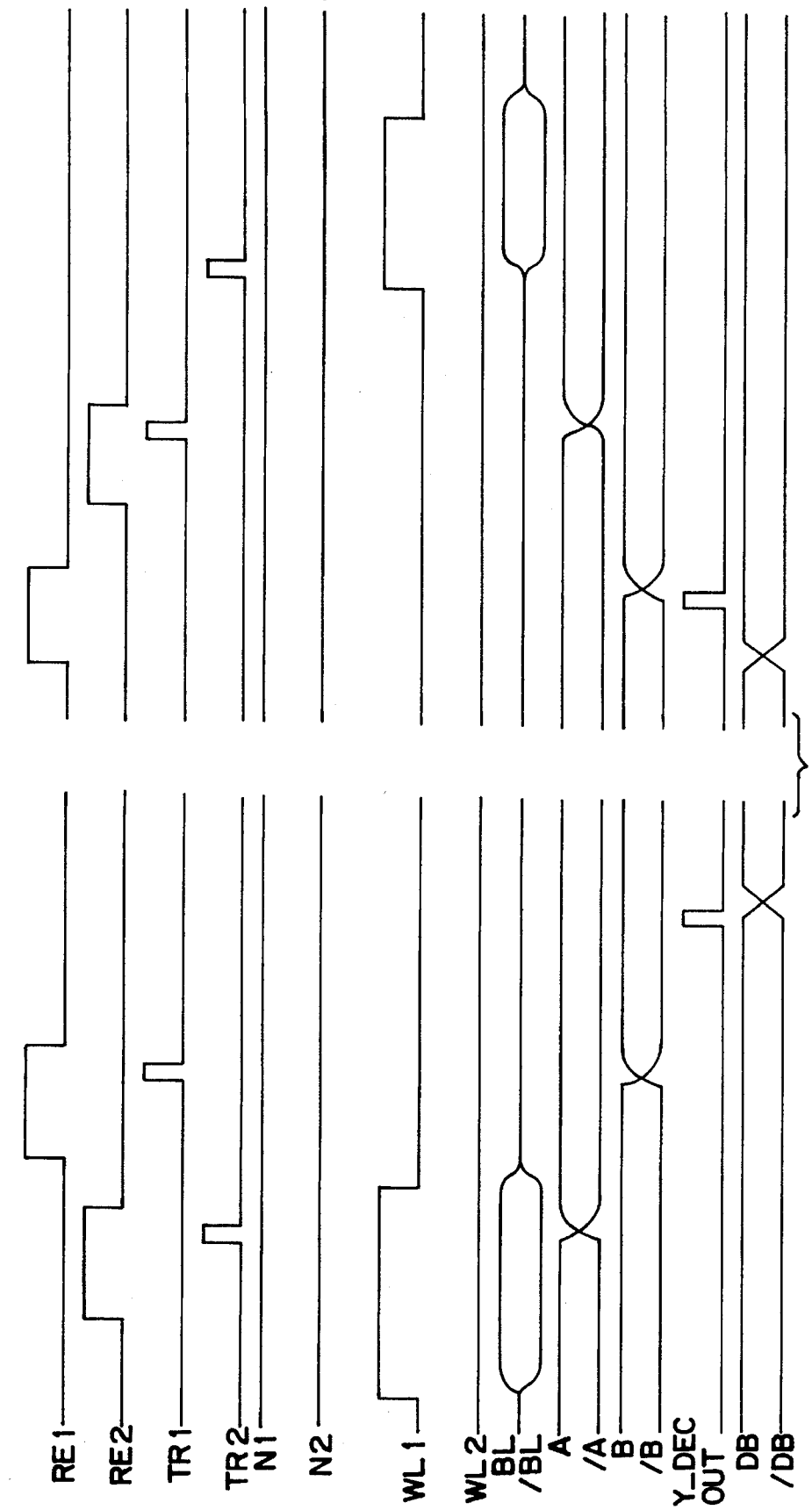
FIG. 5 is a chart showing the timing operation of the circuit for controlling a serial access memory according to the present invention.

Thus the voltage distribution of bit lines BL and /BL becomes as shown in FIG. 5. Signal RE2 of R/W control section then becomes high to put the power supply line of the second register in a high impedance state. At the same time, control signal TR2 which controls second transmission switch 132 becomes high, thereby connecting bit lines BL and /BL to bit lines A and /A of the second register. Consequently, the voltage states of bit lines BL and /BL are transmitted to the second register to be stored there. Then, signal RE2 is shifted to a low level to put the power line of the second register to a high impedance, so that full voltage is supplied to the second register, thereby stabilizing the data. Thereafter, even when the operation of the word line and the sense amplifier are stopped, the second register retains the stored data.

Signal RE1 of R/W control section then becomes high to put the power line of the first register to a high impedance state. At the same time, signal TR1 which controls second transmission switch 122 becomes high to connect bit lines A and /A of the second register to bit lines B and /B of the first register. Consequently, the voltage state of bit lines A and /A are transmitted to the first register to be stored there. Then signal RE1 becomes low to put the power line of the first register to a high impedance, so that power is supplied to the first register, thereby stabilizing the data. Thus, the first register retains the cell data.

Then output signal Y-DECOUT of the Y decoder, which controls sequential transmission switch 112, becomes high to connect the data bus 152 to bit lines B and /B of the first register. Consequently, the data of the first register is transmitted through bit lines B and /B to data lines DB and /DB. Thereafter, as illustrated in FIG. 1, the parallel data is converted into serial data by the I/O control buffer section to be transmitted through I/O lines.

When carrying out a write operation, signal RE1 of the R/W control section becomes high to put the power line of the first register to a high impedance state. Then the serial data transmitted from the I/0 control section through the I/O lines are converted into parallel data so as to be loaded on data lines DB and /DB. Output signal Y-DECOUT of the Y decoder which controls sequential transmission switch 112 becomes high, so the latter is turned on. Consequently, the data on data buses DB and /DB is transmitted through bit lines B and /B of the first register and stored there. Then signal RE1 becomes low, so that the power source voltage is supplied to the first register, thereby stabilizing the data. Thereafter, regardless of the states of data lines DB and /DB, the data is retained by the first register. In typical operation, register 82 has many memory elements, and therefore, the above described operation is repeated until the total memory elements of the register are filled.

Thereafter, signal RE2 of the R/W control section becomes high to put the power line of the second register 92 to a high impedance state. Then signal TR1 becomes high to connect bit lines A and /A of the second register to bit lines B and /B of the first register. Consequently, the voltage states of bit lines B and /B are transmitted to the second register to be stored there. Signal RE2 then becomes low to put the power line of the second register to a high impedance, and therefore, the power source voltage is supplied to the second register, thereby stabilizing the data. When voltage is applied to word lines WL1 and WL2 and the transistor of the relevant cell is turned on, so that the voltages of bit lines BL and /BL can be supplied to the cell capacitor. Signal TR2 then becomes high to connect bit lines BL and /BL to bit lines A and /A of the second register. Consequently, the voltages of bit lines A and /A of the second register are connected to the cell capacitor to be stored in the capacitor as charges. Then the voltages of the word lines are removed, and the cell transistor is turned off, so that the charge of the capacitor is preserved.

In the present invention, during a read operation, control signal RE2 is shifted to a high state prior to transmitting the data from memory cell array 142, so that one of the PMOS transistors in the control means for connecting the power source of the registers is turned off, thereby increasing the impedance of the power line. In this state, signal TR2 of the second transmission switch is shifted to a high state, thereby transmitting the data. In this way, the impedance of data source side bit lines BL and /BL becomes considerably lower than the power source impedance of the registers, and, therefore, the data is transmitted from the memory cells to register 92 in a stable manner. After the data has been completely transmitted, signal RE2 goes to a low state, so that power can be supplied to the second register in a stable manner. Further, after maintaining the power source impedance at a low level, control signal RE1 of first register 82, and signal TR1 are set to a high state. In this way, the power source impedance of first register 82 is made to be lower than the power source impedance of second register 92, so that the data can be transmitted in a stable manner.

In order to repeatedly carry out data transmission and read/write operations, registers may be connected not in series but in parallel as illustrated, and are alternately operated to obtain an enhanced efficiency. That is, any two registers, e.g., 82 and 92, are connected in parallel to receive and memorize data from the memory cells through bit lines and through a comprehensive transmission switch. Further, a sequential transmission switch which connects the registers to the data buses is also connected to their respective data buses, thereby forming a circuit for controlling a serial access memory.

Figure 6:
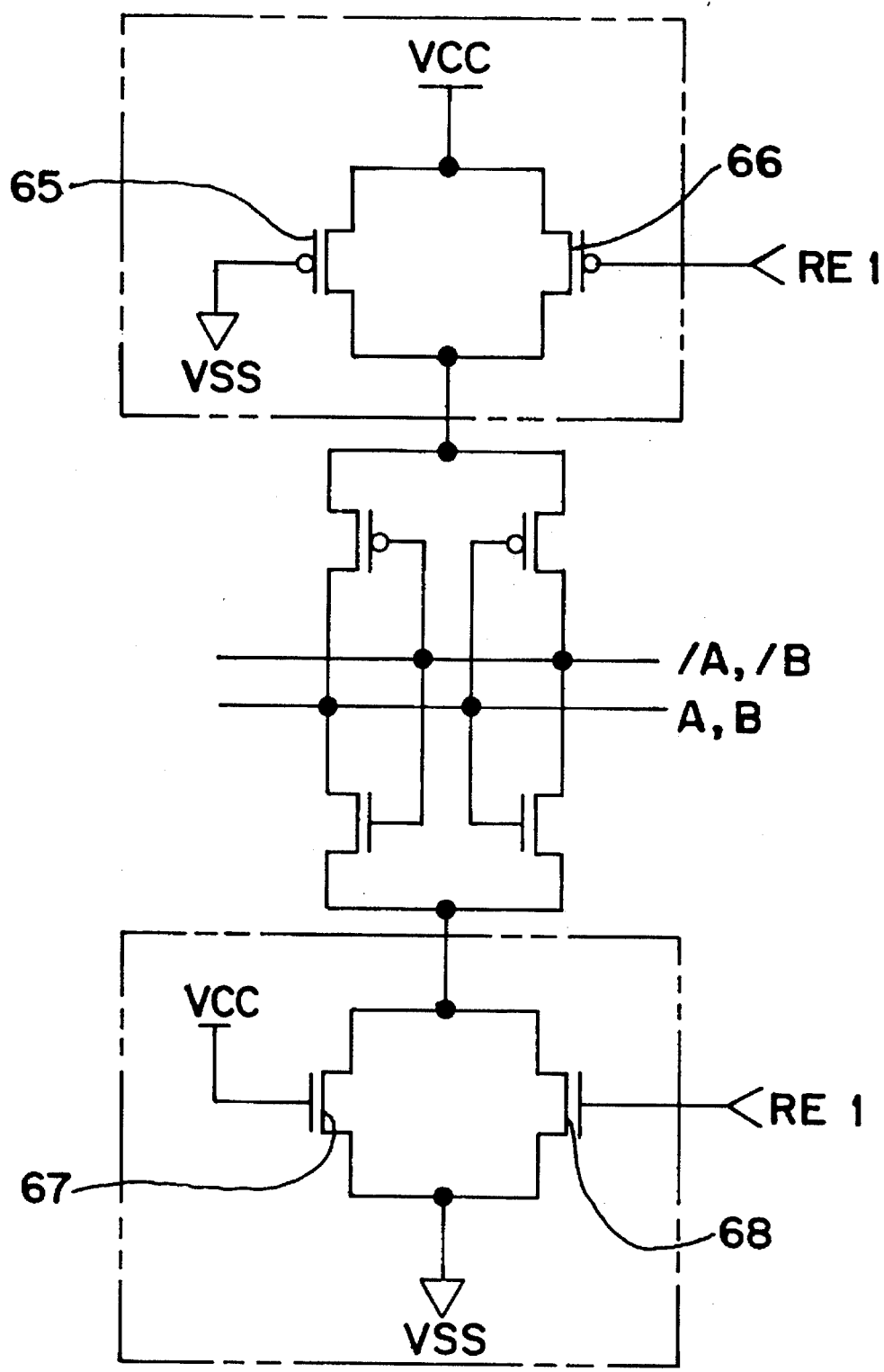
FIG. 6 illustrates another embodiment of the multi-stage impedance controlling means according to the present invention.

FIG. 6 illustrates another embodiment of a multi-stage impedance controlling means according to the present invention.

In this embodiment, as a multi-stage impedance controlling means, first MOS transistor 66 and second MOS transistor 65 are connected in parallel between the power source and the registers. Further, third MOS transistor 68 and fourth MOS transistor 67 are connected in parallel between the registers and ground. The gates of first MOS transistor 66 and third MOS transistor 68 are connected to control signals RE1 or RE2 to form a high impedance at the time point of the data transmission. Further, the gates of second MOS transistor 65 and fourth MOS transistor 67 are connected to a fixed voltage. In the drawing, the first and second transistors are PMOS transistors, while the third and fourth transistors am NMOS transistors. The gate of the second PMOS transistor is connected to ground potential, while the gate of the fourth NMOS transistor is connected to the power source voltage.

In this way, the impedance variation range for the power line of the registers is enlarged, and, therefore, the data transmission can be carried out in an even more stable manner as compared with the embodiment of FIG. 4. The operation of this circuit is essentially the same as that of the first embodiment of the present invention.

According to the present invention as described above, the power source line impedances for the data transmitting section and the data receiving section can be controlled, and, therefore, the impedance of the transmitting section together with the data is transmitted to the receiving section without any loss of the voltage level. Therefore, a stable data transmission is ensured, and transmission speed is considerably improved. Further, the noises which are generated upon turning the power on and off are significantly reduced.

Although various preferred embodiments of the present invention have been disclosed for illustrative purposes, those skilled in the art will appreciate that various modifications, additions and /or substitutions are possible without departing from the scope and spirit of the present invention as disclosed in the claims.

What is claimed is:

1. A circuit for controlling data transmissions associated with a serial access comprising:

a pair of bit lines for transmitting data, the bit lines being coupled to a memory cell array;

one or more storage registers for storing the data from the bit;

one or more switches connecting each of the registers to a data bus, and wherein the switches are sequentially activated in accordance with selection signals of an address; and a multi-stage impedance controlling means for controlling an impedance of a power line for said registers during said data transmissions.

2. The circuit of claim 1, wherein said impedance controlling means comprises:

first and second MOS transistors connected in parallel between a power source and said registers;

said first MOS transistor having a gate connected to a control signal for forming a high impedance at some time during data transmission; and said second MOS transistor having a gate connected to a fixed voltage.

3. The circuit of claim 2, wherein said first and second MOS transistors are PMOS transistors; and the gate of said second MOS transistor is connected to a ground potential.

4. The circuit of claim 1, wherein said multi-stage impedance controlling means comprises:

first and second MOS transistors connected in parallel between a power source and said registers;

third and fourth MOS transistors connected in parallel between said registers and a ground potential;

said first and third MOS transistors having gates connected to control signals to form a high impedance at some time during data transmission; and said second and fourth MOS transistors having gates connected to a fixed potential.

5. The circuit of claim 4, wherein:

said first and second MOS transistors are PMOS transistors;

said third and fourth MOS transistors are NMOS transistors;

the gate of said second MOS transistor is connected to the ground potential; and the gate of said fourth MOS transistor is connected to a power source voltage.

6. The circuit of claim 1, wherein said storage register consists of first and second registers which are serially connected, and a transmission switch controls the transmission of data between them.

7. The circuit of claim 1, wherein said storage register consists of first and second registers which are connected in parallel between said memory cell array and said data bus, the registers being coupled to a sequential transmission switch and a transmission switch for transmitting and receiving transmitting data to and from the data bus.

8. The circuit of claim 6, wherein said impedance controlling means comprises: first and second MOS transistors connected in parallel between a power source and said registers;
said first MOS transistor having a gate connected to a control signal for forming a high impedance at some time during data transmission; and
said second MOS transistor having a gate connected to a fixed voltage.

9. The circuit of claim 7, wherein said impedance controlling means comprises:
first and second MOS transistors connected in parallel between a power source and said registers;
said first MOS transistor having a gate connected to a control signal for forming a high impedance at some time during data transmission; and
said second MOS transistor having a gate connected to a fixed voltage.

10. The circuit of claim 8, wherein said first and second MOS transistors are PMOS transistors, and the gate of said second MOS transistor is connected to a ground potential.

11. The circuit of claim 9, wherein said first and second MOS transistors are PMOS transistors, and the gate of said second MOS transistor is connected to a ground potential.

12. The circuit of claim 6, wherein said multi-stage impedance controlling means comprises:
first and second MOS transistors connected in parallel between a power source and said registers;
third and fourth MOS transistors connected in parallel between said registers and a ground potential;
said first and third MOS transistors having gates connected to control signals to form a high impedance at some time during data transmission; and
said second and fourth MOS transistors having gates connected to a fixed potential.

13. The circuit of claim 7, wherein said multi-stage impedance controlling means comprises:
first and second MOS transistors connected in parallel between a power source and said registers;
third and fourth MOS transistors connected in parallel between said registers and a ground potential;
said first and third MOS transistors having gates connected to control signals to form a high impedance at some time during data transmission; and
said second and fourth MOS transistors having gates connected to a fixed potential.

14. The circuit of claim 12, wherein:
said first and second MOS transistors are PMOS transistors;
said third and fourth MOS transistors are NMOS transistors;
the gate of said second MOS transistor is connected to the ground potential; and
the gate of said fourth MOS transistor is connected to the power source voltage.

15. The circuit of claim 13, wherein:
said first and second MOS transistors are PMOS transistors;
said third and fourth MOS transistors are NMOS transistors;
the gate of said second MOS transistor is connected to the ground potential; and
the gate of said fourth MOS transistor is connected to the power source voltage.

16. A method of loading data into a register, said register being coupled by a pair of bit lines to a data bus and a memory cell, said cell including a cell MOS transistor, said bit lines being controlled by a pair of corresponding bit line transfer MOS transistors, and said register further being coupled to a power supply through an impedance control circuit including two or more impedance control MOS transistors, said method comprising the steps of:
applying a word line signal during a first time period to said cell transistor to transfer said data to said bit lines;
applying a read or write signal to one of said impedance control transistors during a second time period to place said impedance control circuit in a high impedance state; and
applying a transfer signal to said bit line transfer transistors during a third time period to transfer said data from said bit lines to said register;
wherein the second time period for the read or write signal not does not completely overlap the third time period for the transfer signal.

17. The method of claim 16, wherein the read or write signal is applied to said impedance control circuit before the transfer signal has been applied to the bit line transfer transistors.

18. The method of claim 16, wherein the read or write signal is applied to said impedance control circuit after the transfer signal has been applied to the bit line transfer transistors.

19. The method of claim 16, wherein said impedance control circuit comprises:
first and second impedance control MOS transistors connected in parallel between said power supply and said register;
said first MOS impedance control transistor having a gate coupled to a read or write signal for forming a high impedance state in said control circuit; and
said second MOS impedance control transistor having a gate connected to a fixed voltage.

20. The method of claim 16, wherein said first and second impedance control MOS transistors are PMOS transistors.

21. The method of claim 16, wherein said impedance control circuit further includes:
third and fourth impedance control MOS transistors connected in parallel between said register and a ground potential;
said first and third MOS impedance control transistors having gates coupled to a read or write signal for forming a high impedance state in said control circuit; and
said second and fourth MOS impedance control transistor having gates connected to a fixed voltage.

22. The method of claim 16, wherein said register is coupled by a pair of second bit lines to a second register, said second bit lines being controlled by a pair of corresponding second bit line transfer MOS transistors, and said second register further being coupled to said power supply through a second impedance control circuit including two or more second impedance control MOS transistors, and said second register is loaded from said register with the following steps:

applying a second read or write signal to one of said second impedance control transistors during a fourth time period to place said second impedance control circuit in a high impedance state; and applying a second transfer signal to said second bit line transfer transistors during a fifth time period to transfer said data from said second bit lines to said second register;

wherein the fourth time period for the read or write signal not does not completely overlap the fifth time period for the transfer signal.

23. The method of claim 22, wherein the second read or write signal is applied to said impedance control circuit before the second transfer signal has been applied to the second bit line transfer transistors.

24. The method of claim 23, wherein the second read or write signal is applied to said impedance control circuit after the second transfer signal has been applied to the second bit line transfer transistors.

* * * * *